United States Patent [19]
Michaelis

[11] Patent Number: 6,156,606
[45] Date of Patent: Dec. 5, 2000

[54] METHOD OF FORMING A TRENCH CAPACITOR USING A RUTILE DIELECTRIC MATERIAL

[75] Inventor: Alexander Michaelis, Wappingers Falls, N.Y.

[73] Assignee: Siemens Aktiengesellschaft, Munich, Germany

[21] Appl. No.: 09/193,203

[22] Filed: Nov. 17, 1998

[51] Int. Cl.$^7$ ............................................. H01L 21/8242
[52] U.S. Cl. ........................ 438/243; 438/239; 438/240; 438/243; 438/253; 438/386
[58] Field of Search ........................... 438/243, 386, 438/253, 239, 240

[56] References Cited

U.S. PATENT DOCUMENTS

| 4,200,474 | 4/1980 | Morris | 148/1.5 |
| 5,202,152 | 4/1993 | Giannelis et al. | 427/108 |
| 5,357,132 | 10/1994 | Turner | 257/305 |
| 5,587,039 | 12/1996 | Salimian | 156/345 |
| 5,696,017 | 12/1997 | Ueno | 438/253 |

FOREIGN PATENT DOCUMENTS

| 0 822 599 A2 | 7/1997 | European Pat. Off. . |
| 0 843 361 A1 | 11/1997 | European Pat. Off. . |

*Primary Examiner*—David Hardy
*Assistant Examiner*—José R Diaz
*Attorney, Agent, or Firm*—Donald B. Paschburg

[57] ABSTRACT

A method of forming semiconductor devices in accordance with the present invention includes the steps of providing a deep trench in a substrate, the deep trench having a lower portion and forming a dielectric layer in the deep trench by lining the lower portion of the deep trench with a dielectric layer, the dielectric layer including titanium. A semiconductor device includes a substrate having a trench formed therein, a storage node formed in the trench and capacitively coupled to the substrate and a dielectric layer formed in the trench between the storage node and the substrate, the dielectric layer lining a lower portion of the trench wherein the dielectric layer includes titanium oxide.

20 Claims, 5 Drawing Sheets

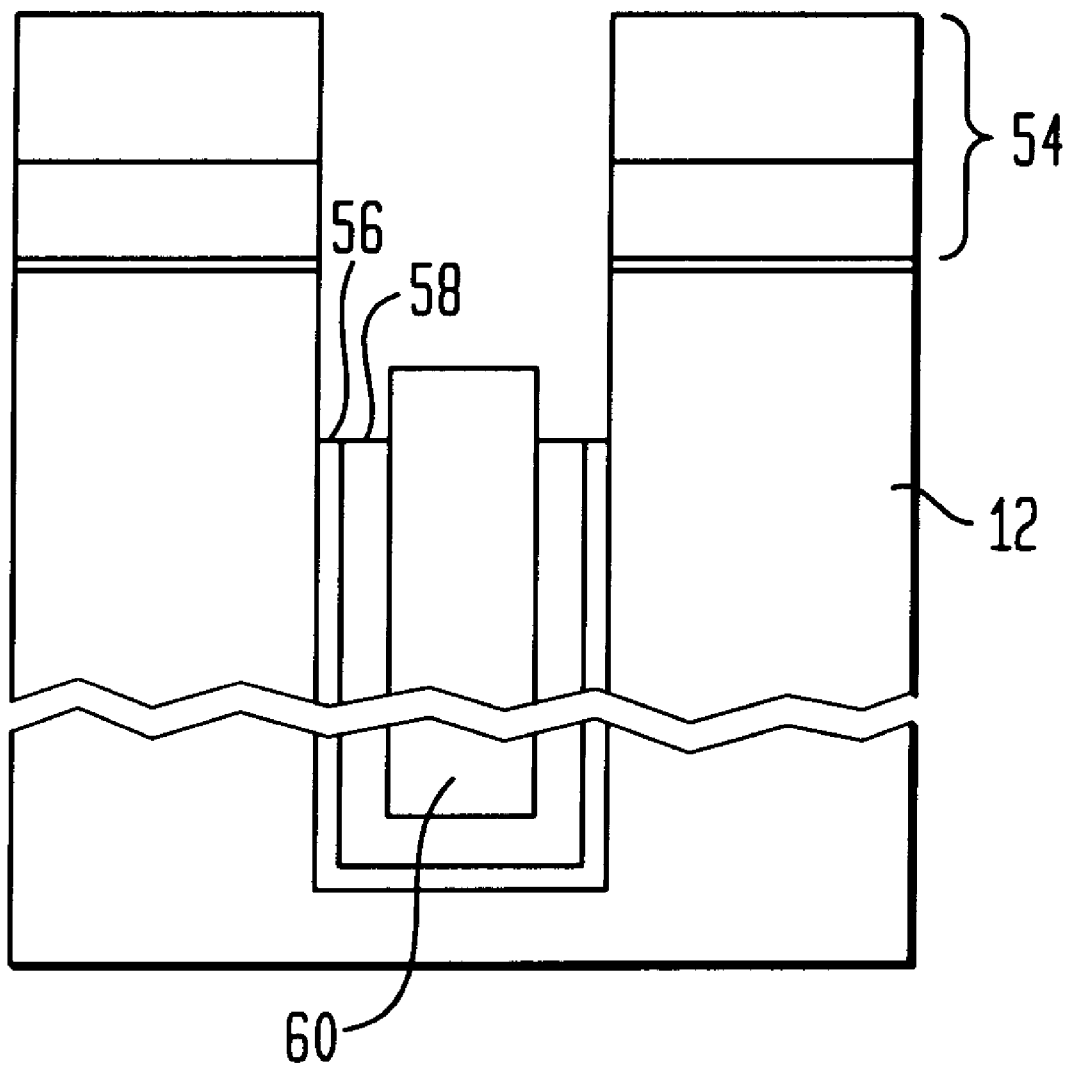

METHOD OF FORMING A TRENCH CAPACITOR USING A RUTILE DIELECTRIC MATERIAL

BACKGROUND

1. Technical Field

This invention relates to semiconductor devices and more particularly, to an improved dielectric layer and method of formation thereof.

2. Description of the Related Art

Semiconductor memory cells include capacitors accessed by transistors to store data. Data is stored as a high or low bit depending on the state of the capacitor. The capacitor's charge or lack of charge indicates a high or low when accessed to read data, and the capacitor is charged or discharged to write data thereto.

Deep trench (DT) capacitors are among the types of capacitors used in semiconductor memories. Deep trench capacitors are typically buried within a semiconductor substrate of the device adjacent to or below an access transistor.

For optimum performance of semiconductor memory devices, such as dynamic random access memories (DRAM), the capacitance C of the storage trench capacitor should be maximized while the charge leakage to areas surrounding the capacitor should be minimized. These requirements dictate the use of high quality dielectric materials interposed between the plates of the capacitor.

The capacitance of the trench capacitor is given by the equation, $C = \in \cdot A/d$, where C is the capacitance, $\in$ is the dielectric constant of the material interposed between the plates of the capacitor, A is the area of the capacitor plates, and d is the thickness of the dielectric material separating the plates of the capacitor.

In conventional trench capacitor fabrication, an Oxinitride is typically used as the dielectric material. Oxinitride materials are highly compatible with current deep trench capacitor manufacturing processes and materials and are stable over the high temperature treatments incurred during the formation of deep trench capacitors (up to 1100° C.). However, Oxinitrides typically exhibit a dielectric of about 7, which is insufficient to achieve the required capacitances without changing the geometry of the capacitor in a manner that degrades the leakage characteristics of the capacitor.

Therefore, there remains a need for a method and apparatus for increasing the capacitance of a deep trench capacitor without degrading the leakage characteristics of the device. As seen in the above equation, this objective can be obtained by using a dielectric material having a higher dielectric constant $\in$ which is compatible with the formation process of deep trench capacitors.

SUMMARY OF THE INVENTION

A method of forming semiconductor devices in accordance with the present invention includes the steps of providing a deep trench in a Silicon substrate, the deep trench having a lower portion and forming a dielectric layer in the deep trench by lining the lower portion of the deep trench with a dielectric material including titaniumdioxide ($TiO_2$) in the rutile phase.

Another method of forming semiconductor memory devices includes the steps of providing a deep trench in a substrate, the deep trench having a lower portion, forming an ultrathin (thickness less then about 1 nm) barrier layer such as silicon nitride ($Si_3N_4$) on the silicon substrate and in the deep trench, depositing a titanium dioxide ($TiO_2$) layer, oxidizing and annealing the titanium dioxide layer to form the rutile crystal structure, filling a portion of the deep trench with a conductive filler material to form a storage node and removing portions of the titanium dioxide dielectric layer such that the titanium dioxide layer and the barrier layer line the lower portion of the deep trench.

The barrier layer is preferably less than about 1 nanometer in thickness. The step of forming the dielectric may include depositing rutile ($TiO_2$) by a chemical vapor deposition process. The step of providing a precursor material prior to depositing rutile ($TiO_2$) may also be included. The step of forming the dielectric layer may include forming the dielectric layer by depositing a layer of TiN in the lower portion of the deep trench and oxidizing the layer of TiN to form rutile ($TiO_2$). The step of oxidizing may further include the step of oxidizing the layer of TiN by plasma oxidation. The step of oxidizing may include the step of oxidizing the layer of TiN by rapid thermal oxidation.

A semiconductor device includes a substrate having a trench formed therein, a storage node formed in the trench and capacitively coupled to the substrate and a dielectric layer formed in the trench between the capacitor plates, the dielectric layer lining a lower portion of the trench wherein the dielectric layer includes titanium oxide.

In alternate embodiments, the dielectric layer may include a silicon nitride barrier layer. This layer may be less than about 1 nanometer in thickness. The dielectric layer may include a layer of titanium oxide. The titanium oxide layer is preferably between about 15 nanometers to about 35 nanometers in thickness.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 8 is a cross-sectional view of the trench of FIG. 7 showing a dielectric in accordance with the present invention.

DETAILED DESCRIPTION OF PREFERRED EMBODIMENTS

The present invention relates to semiconductor devices and more particularly, to an improved dielectric layer and method of formation thereof. By increasing the dielectric constant of a dielectric material, higher capacitance is achieved thereby increasing retention time for information bit storage on a storage node. The capacitance for a trench capacitor can be represented by the following expression:

$$C = \in A/d$$

where C is the capacitance, $\in$ is the dielectric constant of the dielectric material, A is the capacitor plate area and d is the thickness of the dielectric material. Capacitance is increased if $\in$ is increased and d is decreased assuming a constant A. By replacing the conventional dielectric material (oxinitride or nitride (ON)) with rutile (titanium oxide ($TiO_2$)), an order of magnitude increase in capacitance can be realized. This is due to the difference in dielectric constants, for example $\in$ equals about 7 for ON and between about 86 to about 170 for rutile. The value of $\in$ for rutile and the amount of leakage current depends on the crystallographic orientation and quality of the rutile film. This correlates to high deposition and annealing temperatures which are described in a process herein. By introducing rutile as a dielectric in accordance with the present invention leakage currents below $10^{-10}$ $A\text{-}cm^{-2}$ may be realized.

The capacitance of a storage cell capacitor is important for the performance of dynamic random access memory (DRAM) devices. Conventionally, nitride is used as a dielectric in deep trench (DT) technology. The dielectric constant, of nitride is about 7. A nitride dielectric thickness d is already approaching its minimum limit of 3.5 nm which is within the tunneling regime. An adjustment of the DT capacitance towards the minimum critical value of about 40 fF/cell becomes increasingly more difficult to achieve using the conventional process.

The present invention describes an apparatus and method which uses rutile as the dielectric material. The dielectric constant of rutile is between about 86 for a crystal orientation with an optical axis (c-axis) perpendicular to a surface and 170 for the c-axis parallel to the surface. Consequently, an increase in the capacitance of at least an order of magnitude is realized if similar node thicknesses are used.

Figure 1:
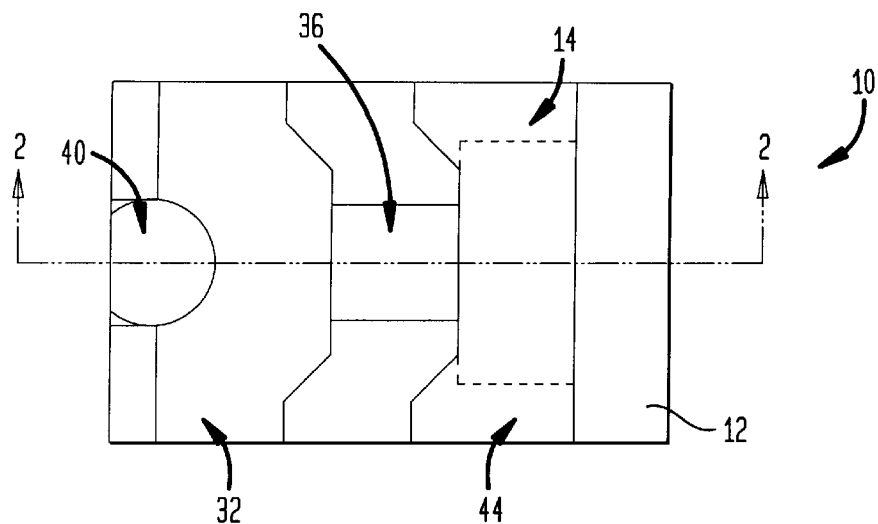
FIG. 1 is a top plan view of a semiconductor device in accordance with the present invention.
Figure 2:
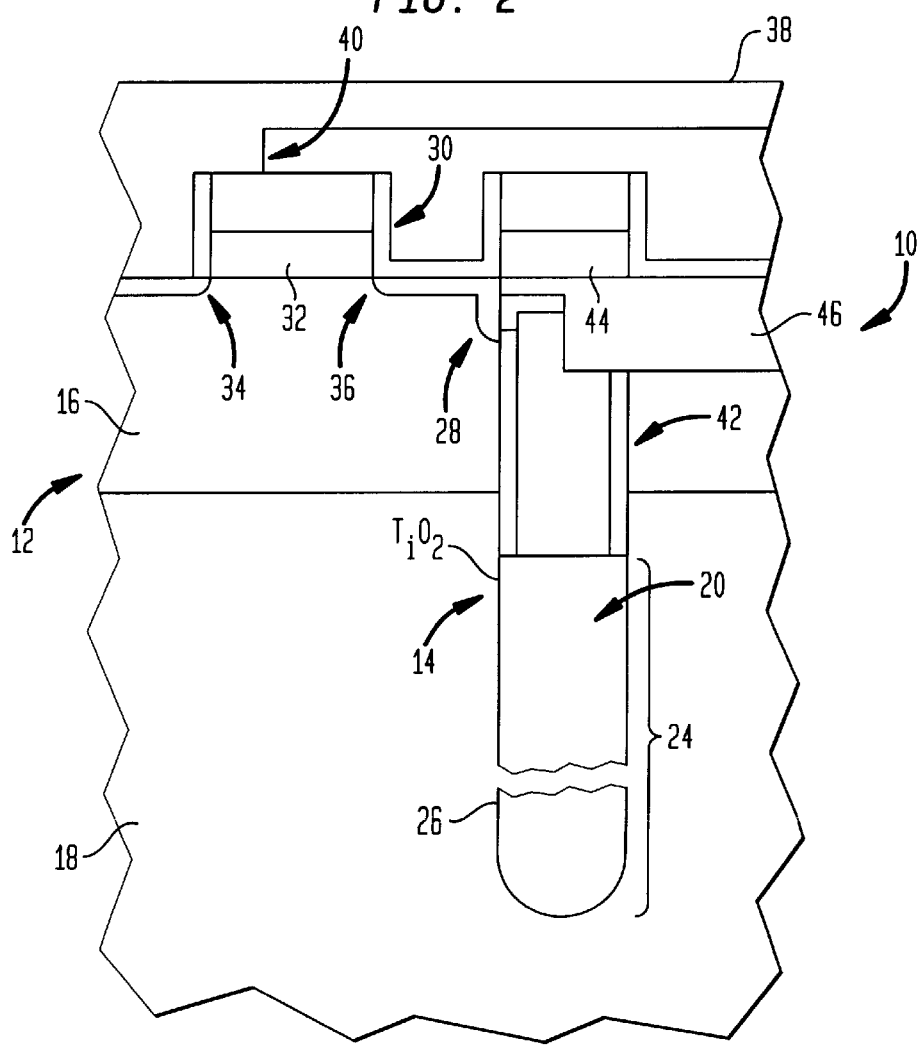
FIG. 2 is a cross-sectional view taken along section line 2—2 of FIG. 1 showing a deep trench capacitor structure in accordance with the present invention.

Referring now in specific detail to the drawings in which like reference numerals identify similar or identical elements throughout the several views, FIGS. 1 and 2 show a fabricated deep trench capacitor 10 in accordance with the present invention. A semiconductor substrate 12 includes a trench (deep trench) 14 formed therein. Substrate 12 includes a well region 16 and a buried capacitor plate 18. Buried plate 18 is capacitively coupled to a storage node 20 formed within trench 14. Storage node 20 includes a conductive material, for example polycrystaline silicon (poly silicon). A lower portion 24 of trench 14 is lined with rutile to form a dielectric layer 26 between the buried capacitor plate 18 and the storage node 20 in accordance with the present invention.

Storage node 20 is electrically coupled by a buried strap 28 to an access transistor 30. Access transistor includes a gate 32 preferably formed from a silicon oxide and contacted by a metal silicide, such as tungsten silicide, and/or poly silicon. When gate 32 is activated, charge flows between diffusion regions 34 and 36 thereby permitting charge to flow to and from a bitline 38 through a bitline contact 40.

Storage node 20 is electrically isolated from well region 16 by a collar 42 formed in trench 14. Collar 42 preferably includes a silicon oxide. Storage node 20 is also isolated from a passing wordline gate 44 by shallow trench isolation 46. Gates 32 and 44 preferably extend along a semiconductor chip and form wordlines as shown in FIG. 1.

Figure 3:
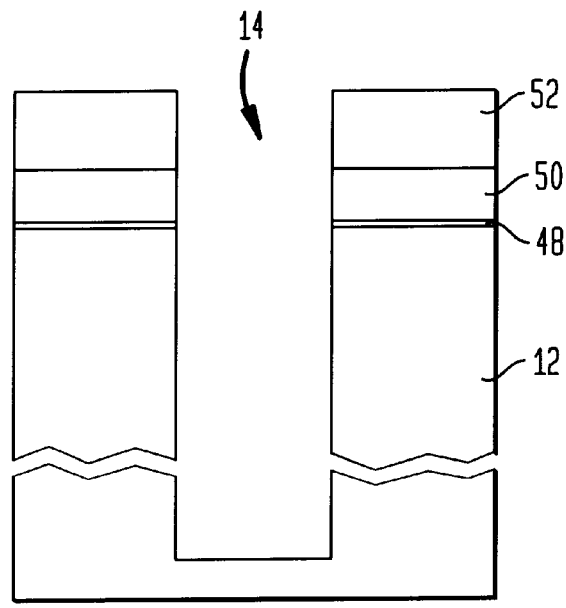
FIG. 3 is a cross-sectional view of a deep trench prepared for implementing the present invention.

Referring to FIG. 3, a method for formation of a rutile dielectric is described. Trench 14 etching is performed preferably using reactive ion etching (RIE). Trench 14 depth may between about 2 to 10 microns. A top down shape of trench 14 may be round to oval and may range in diameters between about 50 and 400 nm. Prior to trench formation, substrate 12 is oxidized to form a pad oxide layer 48 (silicon dioxide) about 5 nm in thickness. A pad nitride layer 50 (silicon nitride) is deposited over pad oxide layer 48. Pad nitride layer 50 may be about 200 nm to about 240 nm in thickness. A glass layer 52, for example borosilicate glass (BSG) is formed on pad nitride layer 50. Glass layer 52 may be about 700 nm in thickness. It is noted the above dimensions and materials are not critical and can be varied as needed.

Pad oxide 48, pad nitride 50 and glass layer 52 are collectively referred to as a pad stack 54. Pad stack 54 is patterned and developed according to known processes, such as by photolithography methods. Holes at locations where trenches 14 are to be formed are fabricated wherein the remaining portions of pad stack 54 act as a hard mask for RIE which follows to form the deep trenches.

It is preferable to employ trench sidewall doping to form the buried capacitor plate 18. Different processes may be used to perform this doping for example, arsenic glass (ASG) deposition with subsequent drive-in of arsenic atoms by diffusion, gas phase doping and/or plasma doping. Collar 42 may be formed at this stage of the method, for example by a localized oxidation of silicon (LOCOS) process or a chemical vapor deposition (CVD) technique. Alternately, collar 42 may be formed prior to the sidewall doping or after dielectric deposition which will be described hereinbelow in further detail.

Exposed sidewall surfaces of trench are annealed to remove any native oxide from the sidewall surfaces and expose bare silicon of substrate 12 (for a silicon substrate). The annealing step is preferably performed in a hydrogen ($H_2$) ambient environment at temperatures of between about 600° C. to about 800° C.

Figure 4:
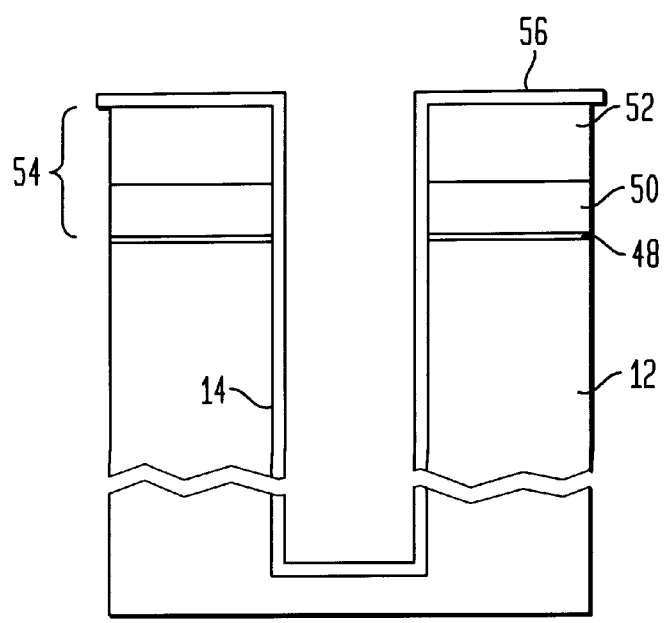
FIG. 4 is a cross-sectional view showing a barrier layer deposited within the trench of FIG. 3 in accordance with the present invention.

Referring to FIG. 4, a barrier layer 56 (i.e, $Si_3N_4$) is formed and lines the trench sidewalls 14. This barrier layer 56 may be formed by exposure of the trench to a hot (about 500–700° C.) $NH_3$ ambient. The thickness of the silicon nitride barrier layer is controlled by the time of exposure to NH3, the pressure within the exposure vessel and the temperature. Preferably, the barrier layer 56 is formed with a thickness below about 1 nm. To prevent native oxide growth, there should be no exposure to air prior to barrier layer deposition. Barrier layer 56 acts as a barrier for oxide diffusion into exposed silicon within trench 14 for subsequent processing steps. Additionally, barrier layer 56 minimizes leakage of charge from the storage node 20 to the buried plate 18. Since barrier layer 56 preferably includes nitride, it is a dielectric layer itself, and it degrades the dielectric constant of the complete stack, i.e., layer 56 may act as a series capacitor. To minimize this effect, barrier layer 56 is preferably formed as thin as possible. For example, nitride layer thicknesses for barrier layer 56 may be 1 nm or less, preferably 0.5 nm or less. Such thin nitride layers are advantageously stable at high temperatures, for example, temperatures up to about 1100° C. Such temperatures are applied in subsequent processing steps.

Figure 5:
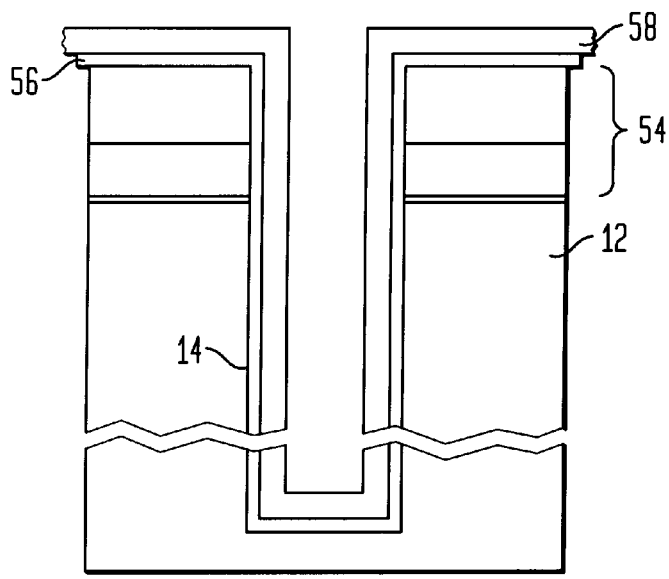
FIG. 5 is a cross-sectional view showing a rutile layer deposited within the trench of FIG. 4 in accordance with the present invention.

Referring to FIG. 5, a titanium dioxide layer 58 is deposited on barrier layer 56. In one method, layer 58 includes TiO$_2$ deposited using a chemical vapor deposition (CVD) process. In a preferred embodiment precursors are used prior to layer 58 deposition. Precursors include TDMAT (Tetrakis(dimethylamido)titanium), TDEAT (Tetrakis(diethylamido)titanium), Ti(0-ipr)$_4$(thd)$_2$ (Bis (isopropoxy)bis(tetramethyleptanedionato)titanium, or Titaniumtetrachloride. Although Titaniumtetrachloride leads to the most conform deposition, it must be balanced against the concern for chloride contamination in the semiconductor device. Layer 58 including TiO$_2$ preferably has a thickness between about 15 nm to about 35 nm, and more particularly of about 25 nm.

Alternately, layer 58 includes TiN deposited using a chemical vapor deposition (CVD) process. TiN can be deposited with high conformity. Layer 58 including TiN preferably has a thickness between about 15 nm to about 30 nm, and more particularly of about 20 nm. The TiN deposition is subsequently transformed into TiO$_2$, preferably by a plasma oxidation or a high temperature (between about 800 to about 1000° C.) furnace oxidation. The following reaction takes place in an oxygen environment:

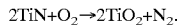

$$2TiN + O_2 \rightarrow 2TiO_2 + N_2.$$

The N$_2$ dissipates in the gas phase. To form a good insulator TiN must be highly oxidized to form the proper 2:1 stoichiometry of TiO$_2$.

Figure 6:
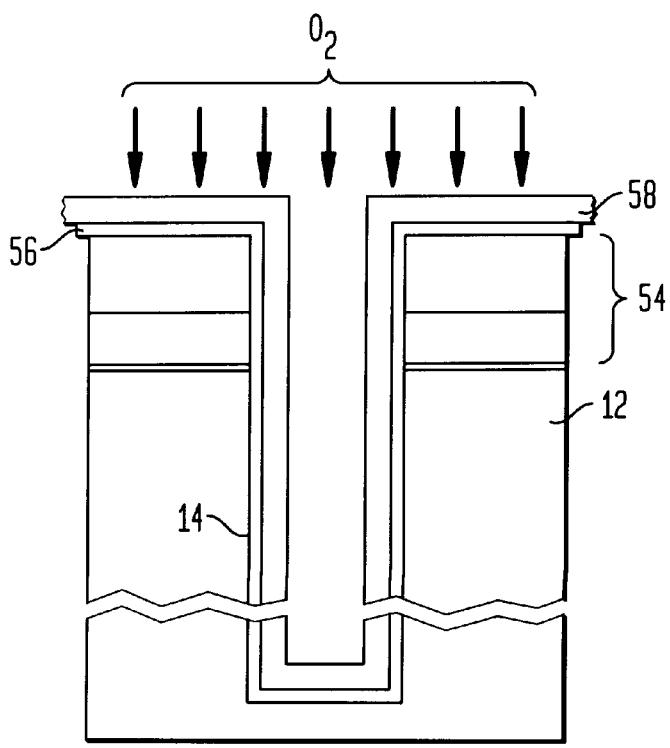
FIG. 6 is a cross-sectional view of the trench of FIG. 5 showing a processing step to modify a crystallographic structure of the rutile layer in accordance with the present invention.

Referring to FIG. 6, once deposited and/or formed, layer 58 is further processed to maximize dielectric constant. This is achieved by establishing a desired crystallographic structure for the titanium dioxide layer 58. A preferred method includes an oxidation, such as furnace or rapid thermal oxidation (RTO), at very high temperatures, for example, between about 750° C. to about 1000° C. During this process, a thermodynamically stable TiO$_2$ (rutile) crystallographic structure will form for layer 58. To further prevent oxygen diffusion into substrate 12 during this process (despite barrier layer 56), an annealing step in an inert ambient atmosphere, such as Ar, He, etc., may be added after this oxidation.

Figure 7:
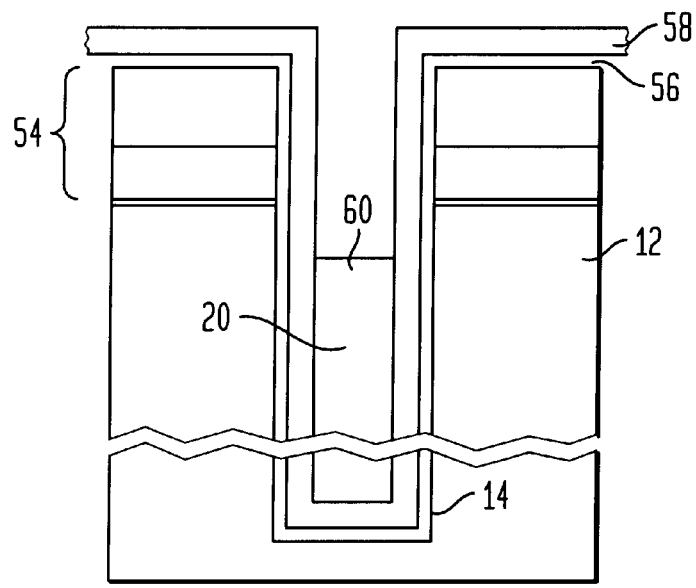
FIG. 7 is a cross-sectional view of the trench of FIG. 6 showing a filler material deposited therein in accordance with the present invention.
Figure 7A:
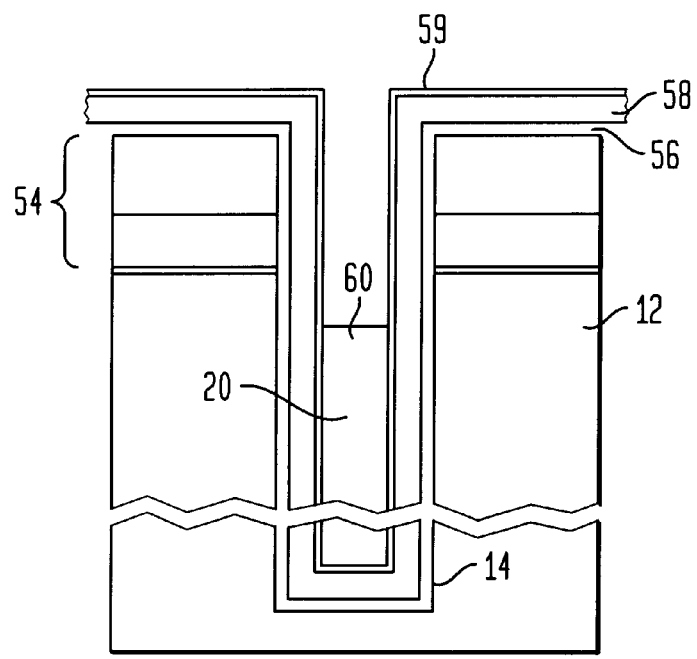
FIG. 7A is a cross-sectional view of the trench of FIG. 6 showing an alternate embodiment wherein a second barrier layer is deposited before depositing the filer material within the trench in accordance with the present invention.

As shown in FIG. 7, a fill material 60 is deposited to form storage node 20 by filling trench 14. As is illustrated in FIG. 7A, before depositing the fill material a second barrier layer 59 of Silicon Nitride may be deposited in order to prevent oxidation of the fill materials. Fill material 60 is preferably polysilicon. Layer 58 and barrier layer 56 are removed in areas not protected by fill material 60 by a wet etching process, for example an HF etch as shown in FIG. 8. The fill material is recessed to form collar 42 as described herein above (FIG. 2). As shown in FIG. 8, remaining in trench 14 is barrier layer 56 and layer 58 forming a dielectric in accordance with the present invention. Further processing continues as is known in the art.

By increasing the dielectric constant of the dielectric material, higher capacitance is achieved thereby increasing retention time for information bit storage on storage node 20 (FIG. 2). An order of magnitude increase in capacitance can be realized. The value of ∈ for rutile is between about 86 to about 170 (polycrystalline rutile has a dielectric constant of about 110), and the amount of leakage current (which depends on the crystallographic orientation and quality of the rutile film) is reduced. By introducing rutile as a dielectric in accordance with the present invention leakage currents below $10^{-10}$ A-cm$^{-2}$ may be realized.

Having described preferred embodiments for a novel apparatus and method for rutile dielectric for semiconductor devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method of forming semiconductor devices comprising the steps of:
    providing a deep trench in a substrate, the deep trench having a lower portion; and
    forming a dielectric layer in the deep trench by lining the lower portion of the deep trench with the dielectric layer, the dielectric layer including a rutile titanuium dioxide layer.

2. The method as recited in claim 1, further comprising the step of annealing the substrate in a hydrogen ambient environment to remove native oxides from the surface of the substrate, said annealing being performed between the steps of providing said deep trench and forming said dielectric layer.

3. The method as recited in claim 2, further comprising the step of forming a barrier layer in the deep trench prior forming said dielectric layer.

4. The method as recited in claim 3, wherein said step of forming said barrier layer includes the step of exposing said deep trench to an NH$_3$ ambient environment at a temperature in the range from about 500° C. to about 700° C.

5. The method as recited in claim 3, wherein the barrier layer is less than about 1 nanometer in thickness.

6. The method as recited in claim 1, wherein the rutile titanium dioxide layer is formed by depositing a titanium dioxide layer by chemical vapor deposition.

7. The method as recited in claim 6, further comprising the steps of:
    oxidizing the titanium dioxide layer; and
    annealing the titanium dioxide layer, to obtain a rutile crystal structure.

8. The method as recited in claim 7, further comprising the step of providing a precursor material prior to depositing the rutile titanium dioxide layer.

9. The method as recited in claim 1, wherein the rutile titanium dioxide layer is formed by:
    depositing a layer of TiN in the lower portion of the deep trench; and
    oxidizing the layer of TiN to form the rutile titanium dioxide layer.

10. The method as recited in claim 9, wherein the step of oxidizing includes the step of oxidizing the layer of TiN by plasma oxidation.

11. The method as recited in claim 9, wherein the step of oxidizing includes the step of oxidizing the layer of TiN by rapid thermal oxidation.

12. A method of forming semiconductor memory devices comprising the steps of:
    providing a deep trench in a substrate, the deep trench having a lower portion;
    annealing the substrate in a hydrogen environment;
    exposing said deep trench to an NH$_3$ environment to form a first nitride barrier layer;
    forming a titanium dioxide rutile dielectric layer in the deep trench;

depositing a second nitride barrier layer over said titanium dioxide rutile dielectric layer;

at least partially filing the deep trench with a conductive filler material thereby forming a storage node; and removing portions of the titanium dioxide rutile dielectric, first nitride barrier, and second nitride barrier layers such that the titanium dioxide rutile dielectric layer and the first and second nitride barrier layers line the lower portion of the deep trench.

13. The method as recited in claim 12, where said step of forming the rutile layer includes the steps of:

depositing a layer of titanium dioxide in the deep trench;

oxidizing the titanium dioxide layer; and annealing the titanium dioxide layer to obtain a rutile crystal structure.

14. The method as recited in claim 13, wherein said annealing step is performed at a temperature in the range from about 750° C. to about 1050° C.

15. The method as recited in claim 12, wherein said first barrier layer is less than about 1 nanometer in thickness.

16. The method as recited in claim 13, wherein the step of depositing the titanium dioxide layer includes a chemical vapor deposition process.

17. The method as recited in claim 16, further comprising the step of providing a precursor material prior to said step of forming said titanium dioxide rutile dielectric layer.

18. The method as recited in claim 12, wherein the step of forming the titanium dioxide rutile dielectric layer includes the steps of:

depositing a layer of TiN in the deep trench; and oxidizing the layer of TiN to form rutile ($TiO_2$).

19. The method as recited in claim 18, wherein the step of oxidizing includes the step of oxidizing the layer of TiN by plasma oxidation.

20. The method as recited in claim 18, wherein the step of oxidizing includes the step of oxidizing the layer of TiN by rapid thermal oxidation.

* * * * *